United States Patent
Martinson et al.

(10) Patent No.: US 9,388,499 B2
(45) Date of Patent: Jul. 12, 2016

(54) ATOMIC LAYER EPITAXY OF HEMATITE ON INDIUM TIN OXIDE FOR APPLICATION IN SOLAR ENERGY CONVERSION

(71) Applicant: UCHICAGO ARGONNE, LLC, Lemont, IL (US)

(72) Inventors: Alex B. Martinson, Naperville, IL (US); Shannon Riha, Park Ridge, IL (US); Peijun Guo, Evanston, IL (US); Jonathan D. Emery, Oak Park, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 14/288,998

(22) Filed: May 28, 2014

(65) Prior Publication Data
US 2015/0345036 A1    Dec. 3, 2015

(51) Int. Cl.
| | | |
|---|---|---|
| *C25B 11/04* | (2006.01) | |
| *C25B 1/00* | (2006.01) | |
| *H01G 9/20* | (2006.01) | |
| *C23C 16/455* | (2006.01) | |
| *C23C 16/40* | (2006.01) | |
| *C30B 25/18* | (2006.01) | |
| *C30B 25/10* | (2006.01) | |
| *C30B 29/16* | (2006.01) | |
| *C30B 25/06* | (2006.01) | |
| *C30B 25/02* | (2006.01) | |

(52) U.S. Cl.
CPC ............ *C25B 11/0452* (2013.01); *C23C 16/406* (2013.01); *C23C 16/45525* (2013.01); *C25B 1/003* (2013.01); *C25B 11/0405* (2013.01); *H01G 9/2027* (2013.01); *C30B 25/02* (2013.01); *C30B 25/06* (2013.01); *C30B 25/10* (2013.01); *C30B 25/183* (2013.01); *C30B 29/16* (2013.01); *Y02P 20/134* (2015.11); *Y02P 20/135* (2015.11)

(58) Field of Classification Search
CPC ........ C30B 29/16; C30B 25/02; C30B 25/06; C30B 25/10; C30B 25/183; C23C 14/34; C23C 16/45525; C25B 11/0405; C25B 11/0452; C25B 1/003; H01G 9/2027; Y02P 20/134; Y02P 20/135
See application file for complete search history.

(56) References Cited

U.S. PATENT DOCUMENTS

| | | | | |
|---|---|---|---|---|
| 6,821,655 | B1 * | 11/2004 | Ohta | ....................... C30B 23/02 428/689 |
| 2008/0305322 | A1 | 12/2008 | Doi et al. | |

OTHER PUBLICATIONS

Substrate Dependent Water Splitting with Ultrathin α—Fe2O3 Electrodes, Zandi et al, J. Phys. Chem. C 2014, 118, 16494-16503.*
Atomic Layer Deposition of Fe2O3 Using Ferrocene and Ozone, Martinson et al, J. Phys. Chem. C 2011, 115, 4333-4339.*

* cited by examiner

*Primary Examiner* — Michael Kornakov
*Assistant Examiner* — Hua Qi
(74) *Attorney, Agent, or Firm* — Foley & Lardner LLP (57) ABSTRACT

A method to provide an article of manufacture of iron oxide on indium tin oxide for solar energy conversion. An atomic layer epitaxy method is used to deposit an uncommon bixbytite-phase iron (III) oxide ($\beta$-$Fe_2O_3$) which is deposited at low temperatures to provide 99% phase pure $\beta$-$Fe_2O_3$ thin films on indium tin oxide. Subsequent annealing produces pure $\alpha$-$Fe_2O_3$ with well-defined epitaxy via a topotactic transition. These highly crystalline films in the ultra thin film limit enable high efficiency photoelectrochemical chemical water splitting.

12 Claims, 7 Drawing Sheets

ATOMIC LAYER EPITAXY OF HEMATITE ON INDIUM TIN OXIDE FOR APPLICATION IN SOLAR ENERGY CONVERSION

STATEMENT OF GOVERNMENT RIGHTS

The United States Government claims certain rights in this invention pursuant to Contract No. DE-AC02-06CH11357 between the United States Government and UChicago Argonne, LLC representing Argonne National Laboratory. The United States Government also claims certain rights in this invention pursuant to research sponsored by the Army Research Lab, ANL Cost Code 8R26900.

FIELD OF THE INVENTION

The invention is directed to an improved process and article of manufacture for solar energy conversion. More particularly, the invention is directed to a method to produce an atomic layer epitaxy of hematite on indium tin oxide to carry out photochemical water splitting.

BACKGROUND OF THE INVENTION

Of the reported phases of iron oxide, only hematite ($\alpha$-$Fe_2O_3$) is considered a promising anode material for photoelectrochemical (PEC) oxidation of water for application in solar fuel production. Indeed, $\alpha$-$Fe_2O_3$ possesses a suitable band gap and alignment for solar absorption and the $O_2$ evolution reaction of water, is terrestrially abundant and inexpensive, and is stability in aqueous, and is therefore considered one of the most attractive options. Within the last 10 years, the improved quality and nanoscale control of $\alpha$-$Fe_2O_3$ photoanodes has spurred a series of record-breaking efficiencies. However, the major limiting factors of hematite is the high recombination rate of photo-generated charge carriers combined with the relatively weak absorption of light, as well as slow water oxidation kinetics at the $\alpha$-$Fe_2O_3$ surface. This means less than 50% of visible light is absorbed within the space-charge layer and can contribute to PEC water splitting. While efforts have been made to improve the intrinsic charge-transport and oxidation kinetic properties of $\alpha$-$Fe_2O_3$ by means of doping and surface modification, $\alpha$-$Fe_2O_3$ may be limited by these properties. While it is difficult to find the same beneficial combination of photoanode properties in other semiconducting materials, it is possible that alternate iron oxide polymorphs may exhibit superior behavior.

Phoelectrochemical investigations of the other reported iron oxide phases, which include $Fe_{1-x}O$, $\beta$-$Fe_2O_3$, $\gamma$-$Fe_2O_3$, $\epsilon$-$Fe_2O_3$, and $Fe_3O_4$, have been largely overlooked in favor of research on $\alpha$-$Fe_2O_3$. This stems from the fact that these polytypes are either metastable and difficult to synthesize in useful forms ($\beta$-$Fe_2O_3$ and $\epsilon$-$Fe_2O_3$), or have not demonstrated significant photoactivity ($Fe_{1-x}O$, $\gamma$-$Fe_2O_3$, $Fe_3O_4$). The $\beta$-$Fe_2O_3$ polymorph, which is our focus here, has no reported natural occurrence and as of yet has found little application. It has been synthesized as a polycrystalline thin film on only a handful of occasions by using iron trifluoroacetylacetone as an iron source in chemical vapor deposition and spray pyrolysis. More commonly, it has been produced as nanoparticulate form via hydrolysis of $FeCl_3$, solid-state reaction of NaCl and $Fe_2(SO_4)_3$, or via thermal decomposition of $Fe(C_{10}H_9CHO)$ or $FeSO_4$ in mesoporous $SiO_2$. While monophasic nanoparticles of $\beta$-$Fe_2O_3$ have been reported, it appears that all $\beta$-$Fe_2O_3$ thin films fabricated to date have been mixed-phase.

$\beta$-$Fe_2O_3$ possesses a bixbyite-type crystal structure (space group $Ia\bar{3}$) with lattice parameter a=9.40. $\beta$-$Fe_2O_3$ is thermodynamically unstable, with reports of transformation to either $\alpha$-$Fe_2O_3$ or $\gamma$-$Fe_2O_3$ upon heating, depending on the morphology and annealing conditions. While pure hematite is a canted antiferromagnet or weak ferromagnet at room temperature, $\beta$-$Fe_2O_3$ is paramagnetic at room temperature.

There is therefore a substantial need for an improved article of manufacture to provide highly efficient solar energy conversion for photochemical oxidation of water and which can be efficiently and rapidly manufactured.

SUMMARY OF THE INVENTION

Epitaxial, isomorphic stabilization of bixbyite-phase iron (III) oxide ($\beta$-$Fe_2O_3$) is obtained by atomic layer deposition (ALD) at low temperatures, such as about 200° C., on an epitaxial tin-doped indium oxide (ITO) thin film template. X-ray diffraction measurements verify the growth of majority phase $\beta$-$Fe_2O_3$ thin films with cube-on-cube epitaxy with respect to the low-index [(100), (110), and (111)] epitaxial ITO/YSZ template. As-grown films are >99 vol % $\beta$-$Fe_2O_3$, and only $Fe_2O_3$ films grown on ITO/YSZ(100) show evidence of minority $\alpha$-phase. Cross-sectional transmission electron microscopy verifies an atomically sharp interface, and atomic force microscopy finds a smooth thin film morphology consisting of 200×200 $nm^2$ grains. Absorption spectroscopy reveals an $\beta$-$Fe_2O_3$ band gap of (1.85 eV), which is ~0.2 eV smaller than that typically observed for hematite $\alpha$-$Fe_2O_3$. Cyclic voltammetry of the unannealed $\beta$-$Fe_2O_3$ thin film photoanodes reveal improved current densities and cathodically-shifted onset voltages of for all $\beta$-$Fe_2O_3$ epitaxial permutations with respect to fired randomly-oriented $\alpha$-$Fe_2O_3$/ITO/YSZ counterparts. Finally, the epitaxial stabilization of the $\beta$-$Fe_2O_3$ induces crystallinity within even the thinnest fabricated films (5 nms), suggesting a route for fabrication of ultrathin $Fe_2O_3$ absorbers.

These and other advantages and features of the invention, together with the organization and manner of operation thereof will become apparent from the detailed description that follows when taken in conjunction with the accompanying drawings described below.

DETAILED DESCRIPTION OF THE PREFERRED EMBODIMENTS

Figure 1A:
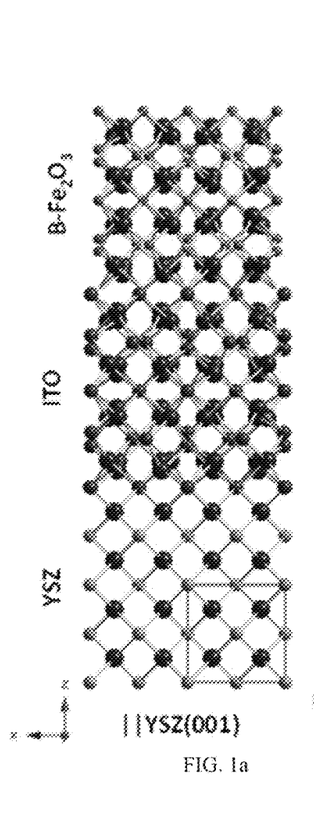
FIGS. 1a-1c show a schematic illustration of the idealized epitaxial $\beta$-$Fe_2O_3$ photoanode grown on low-index YSZ: a) YSZ(001), b) YSZ(011), and c) (111)
Figure 1B:
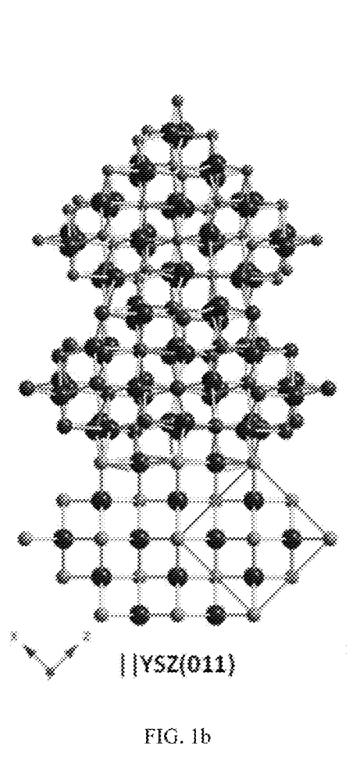
Figure 1C:
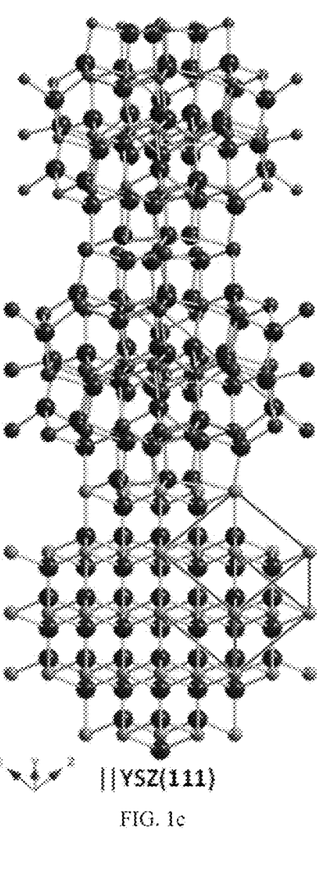

Epitaxial β-Fe$_2$O$_3$ thin films have been grown on low-index [(100)-, (100)-, and (111)-oriented] yttria-stabilized zirconia (YSZ) substrates atomic layer deposited (ALD) indium tin oxide (ITO) (see FIGS. 1a-1c). After annealing the YSZ for 3 hours at 1100° C. to achieve flat, terraced substrate surfaces. Prior to ITO deposition the substrates were cleaned with and acetone and isopropanol rinse, followed by an O$_3$ clean. ITO was deposited using a conventional method using cyclopentadienylindium(I) and tetrakis(dimethylamido)tin as metal precursors and ~5 wt % O$_3$ in O$_2$ as the oxidant. During deposition the ALD reactor chamber was held at to 250° C. The InCp-O$_3$ dose sequence was $t_1$-$t_2$$t_3$$t_4$=1-10-0.1-10, where $t_1$ and $t_3$ are the metalorganic and ozone dose times, respectively, and $t_2$ and $t_4$ are the purge times, reported in seconds. Every tenth ALD cycle was swapped to the TDMASn-O$_3$ dose sequence of 0.5-10-0.1-10. In total, 14 supercycles of 9:1 In$_2$O$_3$:SnO$_2$ were completed, yielding ITO thin films of ~20 nms. ALD was performed of Fe$_2$O$_3$ using ferrocene Fe(Cp)$_2$ and O$_3$. The dose sequence of $t_1$-$t_2$-$t_3$-$t_4$=60-35-90-20. Both Fe(Cp)$_2$ and O$_3$ doses were run using quasi-static exposure to complete oxidation and allow substrate temperatures to remain at about 200° C. An exposure sequence $t_1$-$t_2$-$t_3$-$t_4$=2×(2-28)-5-90-30 for 300 cycles ensures saturating and self-limiting growth. The Fe(Cp)$_2$ dosing was performed in quasi-static mode, in which a two second precursor dose was followed by a 28 second exposure. The Fe(Cp)$_2$ does was performed twice per cycle.

Diffraction measurements, used to identify phase and epitaxy, were performed at sectors 13-BM-C and 33-BM-C at the Advanced Photon Source, Argonne National Laboratory. Samples were mounted under kapton and He was flowed during the duration of the measurement. 15.0 keV (wavelength λ=0.826 Å$^{-1}$) X-rays were focused to a 0.5 mm vertical×2 mm horizontal spot at the detector position, and scattered X-rays were collected using a Pilatus 100K area detector.

Figure 2A:
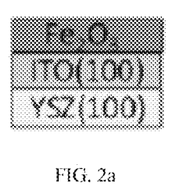
FIGS. 2a-2c are directed to diagrams of heterostructures on various orientations of YSZ and FIGS. 2d-2f show corresponding out of plane thin film X-ray diffraction measurements, respectively.
Figure 2B:
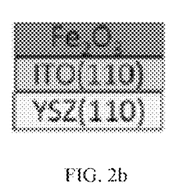
Figure 2C:
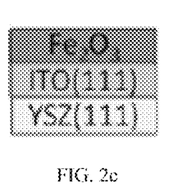
Figure 2D:
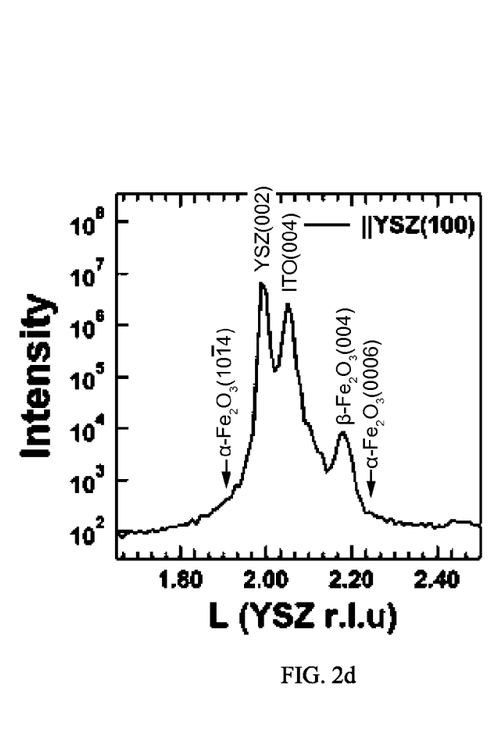
Figure 2E:
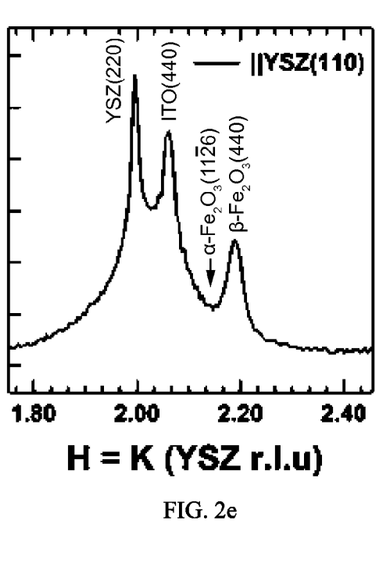
Figure 2F:
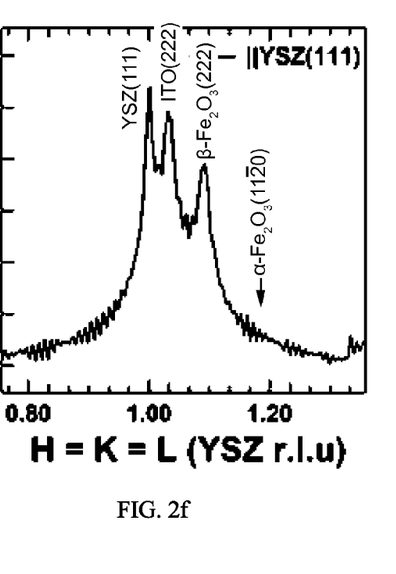
Figure 2G:
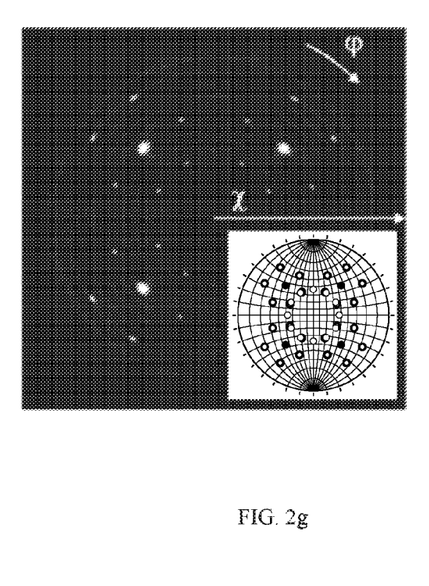
FIGS. 2g-2i are associated pole figures with inset simulation of the heterostructure.
Figure 2H:
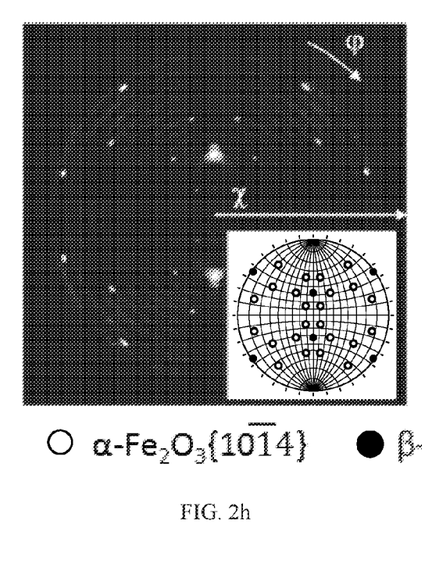
Figure 2I:
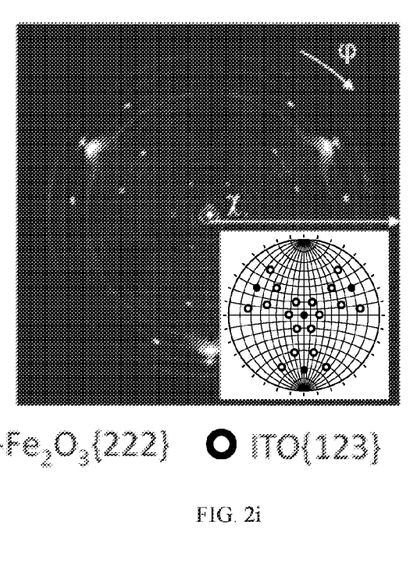

FIGS. 2a-2c show diagrams of the β-Fe$_2$O$_3$/ITO/YSZ heterostructures; FIGS. 2d-2f show out-of-plane thin-film X-ray diffraction measurements for all samples. No sample exhibits diffraction associated with an a-Fe$_2$O$_3$ phase, and only b-Fe$_2$O$_3$ reflections of the same family as the epitaxial ITO are observable, suggesting cube-on-cube epitaxy. Thin film modulation in each scan are a testament to the smooth, uniform thin film character; the FIGS. 2g-2i show X-ray pole figures at a |q| range of =2.16-2.72 Å$^{-1}$ encompassing a d-spacing range including only the α-Fe$_2$O$_3${10$\overline{1}$4}, β-Fe$_2$O$_3${222}, ITO{123} family of reflections.

The epitaxial orientation of β-Fe$_2$O$_3$ crystallites and presence of α-Fe$_2$O$_3$ within the films was determined by the above described X-ray pole figures. The use of a 2D X-ray detector enabled the simultaneous collection of reflections satisfying Bragg conditions between $G_{hkl}$=2π/$d_{hkl}$ q=2.15-2.65 Å$^{-1}$ at each diffractometer colatitude angle χ and azimuthal angle φ (for details, see Refs.). Here, $G_{hkl}$ is the hkl reciprocal lattice point, $d_{hkl}$ is the YSZ lattice spacing, and q=4π Sin(2θ/2)/λ is the momentum transfer. The data can then be reconstructed as a cylindrical volume where each slice along the longitudinal axis corresponds to a range of d-spacings.

The above described pole images show intensity (exponentiated by 0.2) integrated from q=2.28-2.34 Å$^{-1}$ (d=2.68-2.80 Å): a range which includes only the ITO{123}[19], α-Fe$_2$O$_3${10$\overline{1}$4}, β-Fe$_2$O$_3${222} families of reflections. In each figure the β-Fe$_2$O$_3${222} reflections are circled while the weaker ITO(123) are left unindexed. In each case the β-Fe$_2$O$_3${222} reflections are positioned at the same χ and φ values as the YSZ(111) and ITO(222) reflections, verifying the (001)$_{β\text{-}Fe_2O_3}$||(001)$_{ITO}$||(001)$_{YSZ}$ and [001]$_{β\text{-}Fe_2O_3}$||[001]$_{ITO}$|| [001]$_{YSZ}$ epitaxial relationship for all substrates, as indicated by the θ/2θ scans.

A weak set of reflections were indexed (indicated by radially displaced white dots) positioned at χ=38.X° which is 12-fold symmetric in φ. This corresponds to a minority phase of α-Fe$_2$O$_3$ that possesses two crystallographically equivalent orientations with respect to the ITO. We note that while the calculated intensity from the β-Fe2O3 and α-Fe2O3 are within a factor of three or each other, the strength of the β-phase peaks are greater three orders of magnitude that of the α-phase, indicating that <1% of the film consists of α-Fe$_2$O$_3$.

Figure 3A:
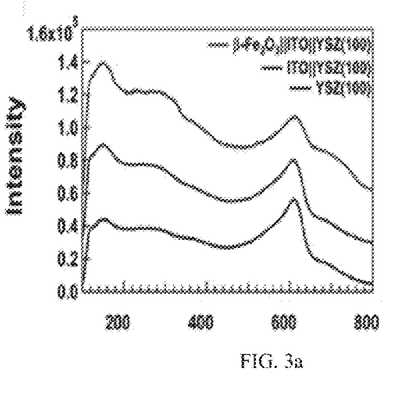
FIGS. 3a-3c show Raman spectra for low-index-oriented $\beta$-$Fe_2O_3$/ITO/YSZ photoelectrodes taken with 633 nm laser light. Peaks denoted with * are attributed to $\beta$-$Fe_2O_3$, no signal from $\alpha$-$Fe_2O_3$, (denoted with |) are observed. Increase in background makes these signal unobservable in A.
Figure 3B:
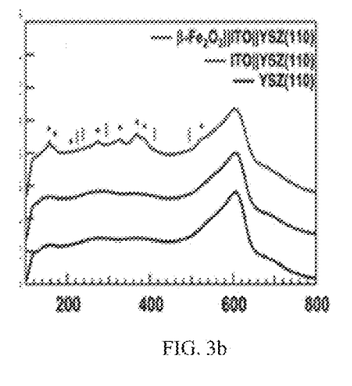
Figure 3C:
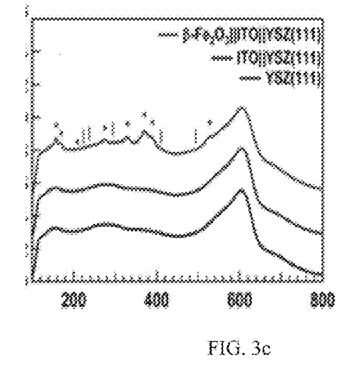
Figure 3D:
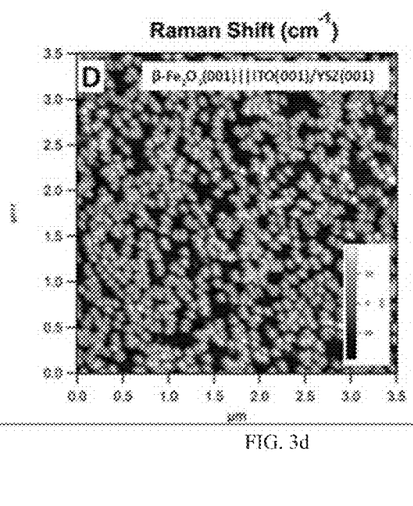
FIGS. 3d-3f show AFM images for all three samples; formation of large (~50 nm heights) particulate islands are observable in D, while smoother films (RMS=~5 nm) in E and F consist of relatively smaller gains (20 nm lateral dimensions)
Figure 3E:
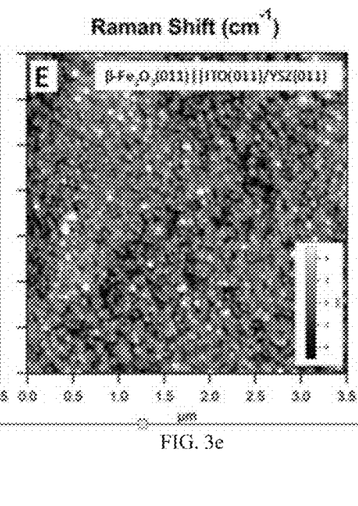
Figure 3F:
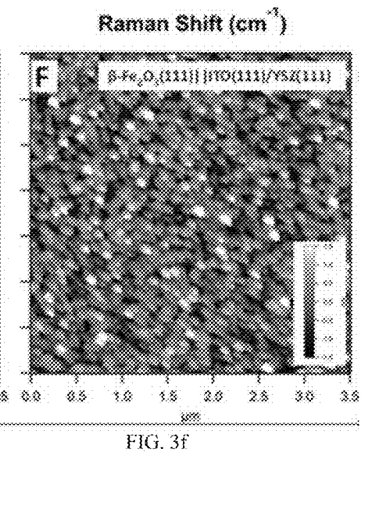
Figure 4:
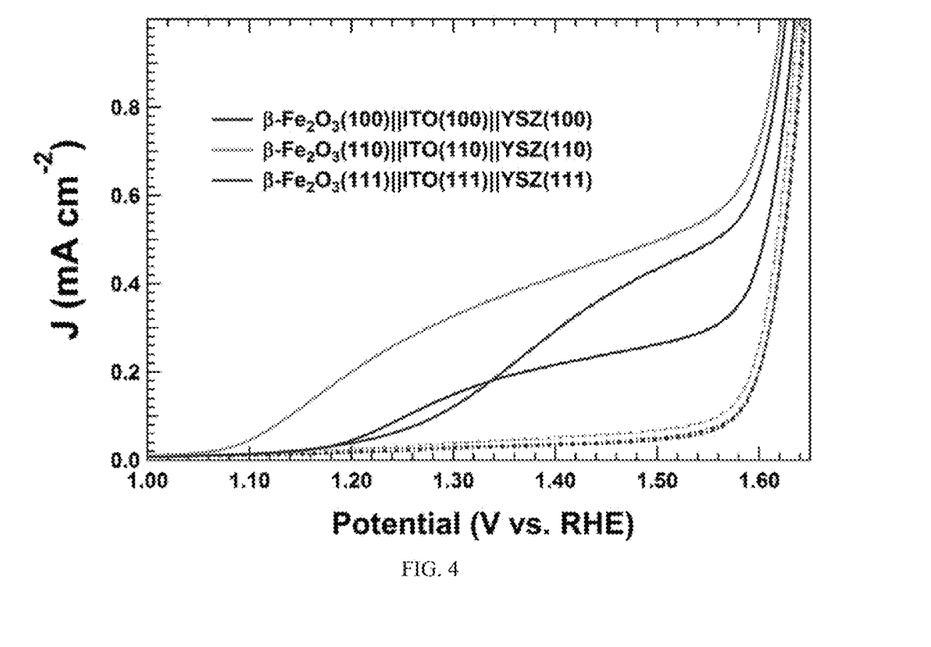
FIG. 4 shows current-voltage measurements in dark (dotted line) and in light (solid line) for low-index-oriented $\beta$-$Fe_2O_3$/ITO/YSZ photoelectrodes. All films are photoactive as grown.

Raman spectra shown in FIGS. 3a-3c were acquired over a range of 100-800 cm$^{-1}$ using a Renishaw inVia spectrometer equipped with a 17 mW He—Ne laser passing 632.8 nm unpolarized light through an 50× objective lens. The associated microstructure are in FIGS. 3d-3f. The scattered light was collected in a back-scattering geometry with an 1800 lines/mm grating and a CCD camera. These are Raman spectra for the Fe$_2$O$_3$/ITO stacks which were grown on each low-index YSZ substrate, as well as ITO/YSZ and YSZ control spectra. In each case, the bare YSZ Raman spectrum possesses a dominant signal near 610 nm$^{-1}$ typically assigned to the $F_{2g}$ phonon mode. The spectra ITO-coated YSZ substrates are identical to the bare YSZ spectra in all cases apart from an increase in lower-frequency intensity for ITO grown on the (100)-oriented YSZ. No evidence was observed of the allowed ITO Raman modes, likely because of the dominance of the broad YSZ spectrum, as well as the chosen excitation wavelength (λ=632.8 nm), which is far from the optical phonon resonance for ITO. The iron oxide films grown on ITO(110)||YSZ(110) and ITO(111)||YSZ(111) show peaks associated with β-Fe$_2$O$_3$ that agree well with the strongest of those reported in the art. For the iron oxide grown on ITO (100)||YSZ(100) we observe no β-Fe$_2$O$_3$ peaks, but instead a broad, largely uniform increase in the Raman scattering across the spectrum. While the source for this increase in scattering is unclear, it is possible that it is washed out by this increase in background signal. Regardless, no spectra indicate the presence of any α-Fe$_2$O$_3$, and this data, together with the phase identification from X-ray diffraction, verify our identification of β-Fe$_2$O$_3$ films.

β-Fe$_2$O$_3$ films have not previously been fabricated in phase-pure form, and therefore have not been investigated as an anode material for photoelectrochemical water splitting. The associated photocurrent density, $J_{sc}$ vs potential for all three unannealed epitaxial thin film stacks is shown in FIG. 4. These data are compared to two co-deposited baseline samples: 1.) an as-deposited Fe$_2$O$_3$/ITO/fused quartz sample and 2.) a Fe$_2$O$_3$/ITO/fused quartz sample that was annealed at 500° C. in 250 sccm O$_2$. As is typical of unfired ALD Fe$_2$O$_3$ samples, the unfired Fe$_2$O$_3$/ITO/fused quartz shows no photoactivity.

The following Examples illustrate a non-limiting description of methods used in the invention and methods of characterization.

Example I

Single crystal YSZ(111) samples were annealed at 1100° C. in 250 sccm high-purity O$_2$ to obtain a smooth, terraced (100 nm) surface. Samples were then sonicated in acetone, followed by isopropyl alcohol for 10 minutes each. After each sonication the substrates were dried with $N_2$. Samples were loaded into the ALD chamber at 250° C. and allowed to thermally equilibrate for 30 minutes before a 180 s ozone ($O_3$) clean.

ALD was performed using a Cambridge Nanotech, Inc. Savannah 200 ALD reactor. Dose duration sequences of $t_1$-$t_2$-$t_3$-$t_4$ were used, where $t_1$ and $t_3$ are dose times (in seconds) for the metal and ozone precursors, respectively, while $t_2$ and $t_4$ are the corresponding purge times. ITO was grown based on the process developed by Elam et at [14]. Cyclopentadienylindium(I) (InCp, 99.99%, Strem) and tetrakis(dimethylamido)tin ($Sn(NMe_2)_4$, 99.99%, Aldrich) were used as metal precursors during ITO growth, and ozone was provided in 5 wt % in 100 sccm high-purity $O_2$ using a DelOzone generator. During deposition the $Sn(NMe_2)_4$ and InCp precursors were held to 55 and 70° C., respectively. The reactor chamber was heated to 250° C. The InCp-$O_3$ dose sequence was 1-10-0.1-10, and every tenth cycle was switched to TDMASn-$O_3$ dose sequence of 0.5-10-0.1-10. In total, 14 supercycles of 9+1 $In_2O_3$ and $SnO_2$ were completed, yielding ITO thin films of 20 nms, as measured by X-ray reflectivity (Phillips X'pert Pro MRD). The average growth rate per cycle was 1.4 Å/cycle, which is comparable to values reported in the prior art. Hall measurements (HMS-3000) in the van der Pauw geometry gave sheet resistances of $\sim 4 \times 10^{-4}$ Ω/sq. $Fe_2O_3$ was grown using ferrocene ($Fe(Cp)_2$, 98%, Aldrich) and $O_3$, using a dose sequence of 60-35-90-20. During $Fe_2O_3$ growth, both $Fe(Cp)_2$ and $O_3$ doses were run using quasi-static exposure.

X-ray pole figures and reciprocal space maps were acquired at beamline 33-BM-C at the Advanced Photon Source, Argonne National Laboratory. Samples were mounted under kapton and He was flowed during the duration of the measurement. 15.0 keV (wavelength=0.826 Å$^{-1}$) X-rays were focused to a 0.5 mm vertical×2 mm horizontal beam, and scattered X-rays were collected using a Pilatus 100K area detector (Dectris). The use of the 2D detector enabled the simultaneous collection of reflections which satisfied the Bragg condition $G_{hk(i)l} = 2\pi/d_{hk(i)l} = q = 2.1-2.4$ Å$^{-1}$ at each diffractometer angle $\chi$ and $\phi$ [21], where $G_{hk(i)l}$ is the hk(i)l reciprocal lattice point, d is the hk(i)l planar spacing, and q is the momentum transfer. The resolution in q was limited to 0.001 Å$^{-1}$ due to the detector pixel size of Q. Further structural information was accessed using transmission electron microscopy.

Example II

Photoelectrochemical (PEC) current-voltage measurements were performed in 0.1 M KOH (pH 13.1) using a CHI10E potentiostat. Measurement were conducted using a three electrode configuration, with Ag/AgCl and Pt as reference and counter electrodes, respectively. PEC data was normalized by the sample surface area exposed to the electrolyte (0.2 cm$^2$). The AM1.5 solar spectrum was simulated using 300 W arc lamp, calibrated to 100 mW/cm$^2$ using a silicon photodiode.

Raman spectra were acquired over a range of 100-1000 cm$^{-1}$ using a Renishaw Ramascope spectrometer equipped with a 632.8 nm He—Ne laser. Data were collected with a 50× objective lens at 100% laser power. Collection time for each spectra was 30 s.

Example III

X-ray diffraction was used to verify the phase and epitaxial relationship between the $Fe_2O_3$ and underlying cube-on-cube ITO(111)||YSZ(111) template. FIG. 2f presents the specular scan along the YSZ[111], where $q_n = 4\pi \sin(2\theta/2)/\lambda$, where $2\theta$ is the scattering angle. For YSZ and ITO, only allowed reflections from the {111} families are observed. For $Fe_2O_3$, no reflections from commonly observed $Fe_2O_3$ phases ($\alpha$-$Fe_2O_3$, $Fe_3O_4$) are observable (FIG. 2f).

Example IV

Figure 5A:
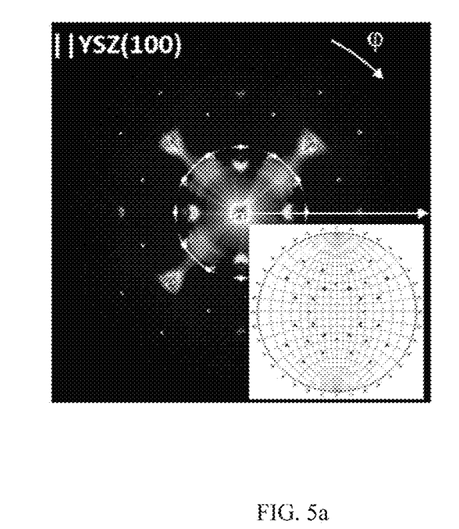
FIG. 5a-c show pole figures for the α-Fe$_2$O$_3$ specimens on various orientations of YSZ after annealing the heterostructures in FIG. 2a-c with inset simulation of the new heterostructure.
Figure 5B:
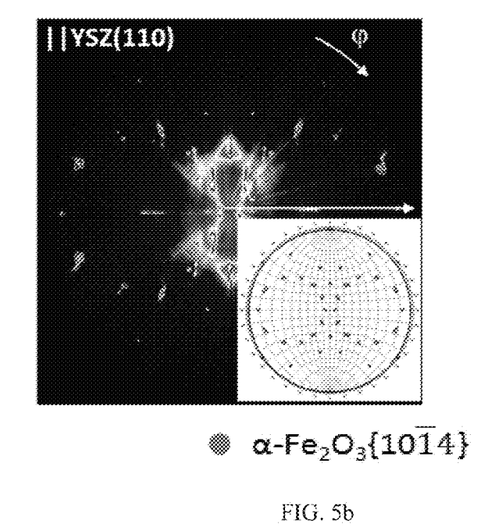
Figure 5C:
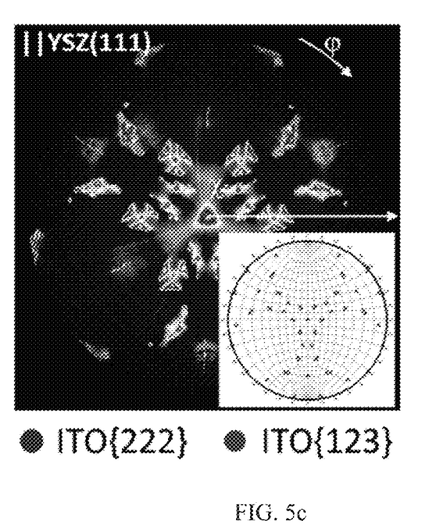

Production of epitaxial $\beta$-$Fe_2O_3$ on ITO/YSZ is produced from the $\beta$-$Fe_2O_3$ heteroepitaxial structures by thermal processing. All low-index $\beta$-$Fe_2O_3$/ITO/YSZ starting samples (see FIG. 5a) were heated to 750° C. in 0.25 sccm $O_2$ for 2 hrs, and pole figure measurements were repeated to probe phase and preferred crystallite orientation. Upon annealing, we found that the diffraction peaks attributed to the epitaxial $\beta$-$Fe_2O_3$ film of FIG. 5a were no longer present, and new peaks indexed to $\alpha$-$Fe_2O_3$ appeared. For $\alpha$-$Fe_2O_3$/ITO/YSZ (100), a 12-fold symmetric ring of $\alpha$-$Fe_2O_3$(1014) reflections formed, as is expected geometrically for a 3 m hexagonal epilayers with rotationally twinned domains sitting atop a 4 mm symmetric substrate. This epitaxial relationship is defined as [0001]$\alpha$-$Fe_2O_3$||ITO[001]||YSZ[001] along the surface normal and <1120>||(100) in-plane. This epitaxial relationship is maintained universally for both $\alpha$-$Fe_2O_3$/ITO/YSZ(110) and $\alpha$-$Fe_2O_3$/ITO/YSZ(111). This epitaxy is dictated by the original $\beta$-$Fe_2O_3$/ITO/YSZ epitaxy, and the transition is found to proceed topotactially, as is observed in the nanoparticulate $\beta$-$Fe_2O_3$ form. Interfacial strain is mitigated by small (a few degrees), symmetric $\alpha$-$Fe_2O_3$ domain tilts about the [110] axes of the YSZ, as observed in the pole figures (see FIGS. 5a-5c).

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A method of manufacturing a thin film article of manufacture for performing photochemical water oxidation, comprising the steps of,
   providing a substrate;
   epitaxially depositing an indium oxide layer on the substrate; and
   epitaxially depositing a $\beta$-$Fe_2O_3$ layer on the indium oxide.

2. The method as defined in claim 1 wherein the substrate comprises a cleaned yttria stabilized zirconia.

3. The method as defined in claim 2 wherein the step of epitaxially depositing the indium oxide comprises forming an indium tin oxide (ITO) layer epitaxially on the substrate.

4. The method as defined in claim 1 wherein the deposition steps are performed by at least one of atomic layer deposition (ALD) and sputtering.

5. The method as defined in claim 4 wherein the ALD method is performed at a chamber temperature of about 200-250° C.

6. The method as defined in claim 1 wherein the epitaxially deposited $\beta$-$Fe_2O_3$ layer was deposited using $Fe(Cp)_2$ and $O_3$.

7. The method as defined in claim 1 wherein the epitaxially deposited $\beta$-$Fe_2O_3$ comprises about 99% by volume of the epitaxially deposited $\beta$-$Fe_2O_3$ layer.

8. The method as defined in claim 3 wherein the epitaxially deposited ITO layer is selected from the group of low index layers of (100), (110) and (111).

9. The method as defined in claim 2 wherein the yttria stabilized zirconia comprises surface planar layers selected from the group of (001), (011) and (111).

10. The method as defined in claim 1 further including a step of annealing the thin film article, thereby topotactially transforming the epitaxially deposited $\beta$-$Fe_2O_3$ layer to an $\alpha$-$Fe_2O_3$ (hematite) layer.

11. The method of claim 1, wherein the epitaxially deposited $\beta$-$Fe_2O_3$ layer is about 5 nm thick has a thickness of about 5 nm.

12. The method of claim 11, wherein the epitaxially deposited indium oxide layer has a thickness of less than about 20 nm.

* * * * *